(12) United States Patent
Tan et al.

(10) Patent No.: US 7,846,800 B2
(45) Date of Patent: Dec. 7, 2010

(54) AVOIDING PLASMA CHARGING IN INTEGRATED CIRCUITS

(75) Inventors: Chung Foong Tan, Singapore (SG); Jae Gon Lee, Singapore (SG); Lee Wee Teo, Singapore (SG); Elgin Quek, Singapore (SG); Chunshan Yin, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 48 days.

(21) Appl. No.: 12/043,148

(22) Filed: Mar. 6, 2008

(65) Prior Publication Data

US 2009/0224326 A1 Sep. 10, 2009

(51) Int. Cl.
*H01L 21/336* (2006.01)

(52) U.S. Cl. ............... 438/275; 438/258; 438/690; 438/706; 257/E29.014

(58) Field of Classification Search ............... 257/360, 257/355, E29.014; 438/197, 258, 266, 275, 438/288, 690, 706, 707
See application file for complete search history.

(56) References Cited

U.S. PATENT DOCUMENTS

| | | | |
|---|---|---|---|
| 5,650,745 A | 7/1997 | Merrill et al. | |
| 5,760,445 A * | 6/1998 | Diaz | 257/356 |
| 5,982,162 A * | 11/1999 | Yamauchi | 323/316 |
| 5,994,742 A | 11/1999 | Krishnan et al. | |
| 6,013,927 A | 1/2000 | Bothra et al. | |
| 6,060,347 A | 5/2000 | Wang | |
| 6,235,642 B1 | 5/2001 | Lee et al. | |
| 6,297,530 B1 * | 10/2001 | Akatsu et al. | 257/327 |
| 6,309,979 B1 | 10/2001 | Patrick et al. | |
| 6,448,599 B1 | 9/2002 | Wang | |
| 6,479,337 B2 * | 11/2002 | Shin | 438/218 |
| 6,624,480 B2 | 9/2003 | Lin et al. | |
| 7,116,606 B2 | 10/2006 | Chou et al. | |
| 2003/0109131 A1 | 6/2003 | Ma | |

OTHER PUBLICATIONS

Pei-Jer Tzeng et al., Plasma Charging Damage on MOS Devices with Gate Insulator of High-Dielectric Constant Material, IEEE Electron Device Letters, Nov. 2001, pp. 527-529, vol. 22, Issue 11.

* cited by examiner

*Primary Examiner*—Davienne Monbleau
*Assistant Examiner*—Eduardo A Rodela
(74) *Attorney, Agent, or Firm*—Horizon IP Pte Ltd (57) ABSTRACT

A circuit having a circuit control terminal, a primary circuit and a protection circuit is provided. The primary circuit includes a primary control terminal and a primary gate oxide of a thickness $T_1$. The primary control terminal is coupled to the circuit control terminal. The protection circuit having a protection control terminal is coupled to the primary circuit. The protection circuit includes a protection gate oxide of a second thickness $T_2$ which is less than $T_1$. The protection gate oxide reduces plasma induced damage in the primary circuit.

20 Claims, 14 Drawing Sheets

AVOIDING PLASMA CHARGING IN INTEGRATED CIRCUITS

FIELD OF THE INVENTION

The present invention relates to integrated circuits or semiconductor devices. More particularly, the invention relates to avoiding plasma induced damage during processing.

BACKGROUND OF THE INVENTION

Reactive ion etch (RIE) is commonly used in the fabrication of integrated circuits. RIE generates reactive plasma which is used to remove materials deposited on a wafer. However, plasma processes, such as RIE, can undesirably cause plasma induced damage (PID).

Figure 1:
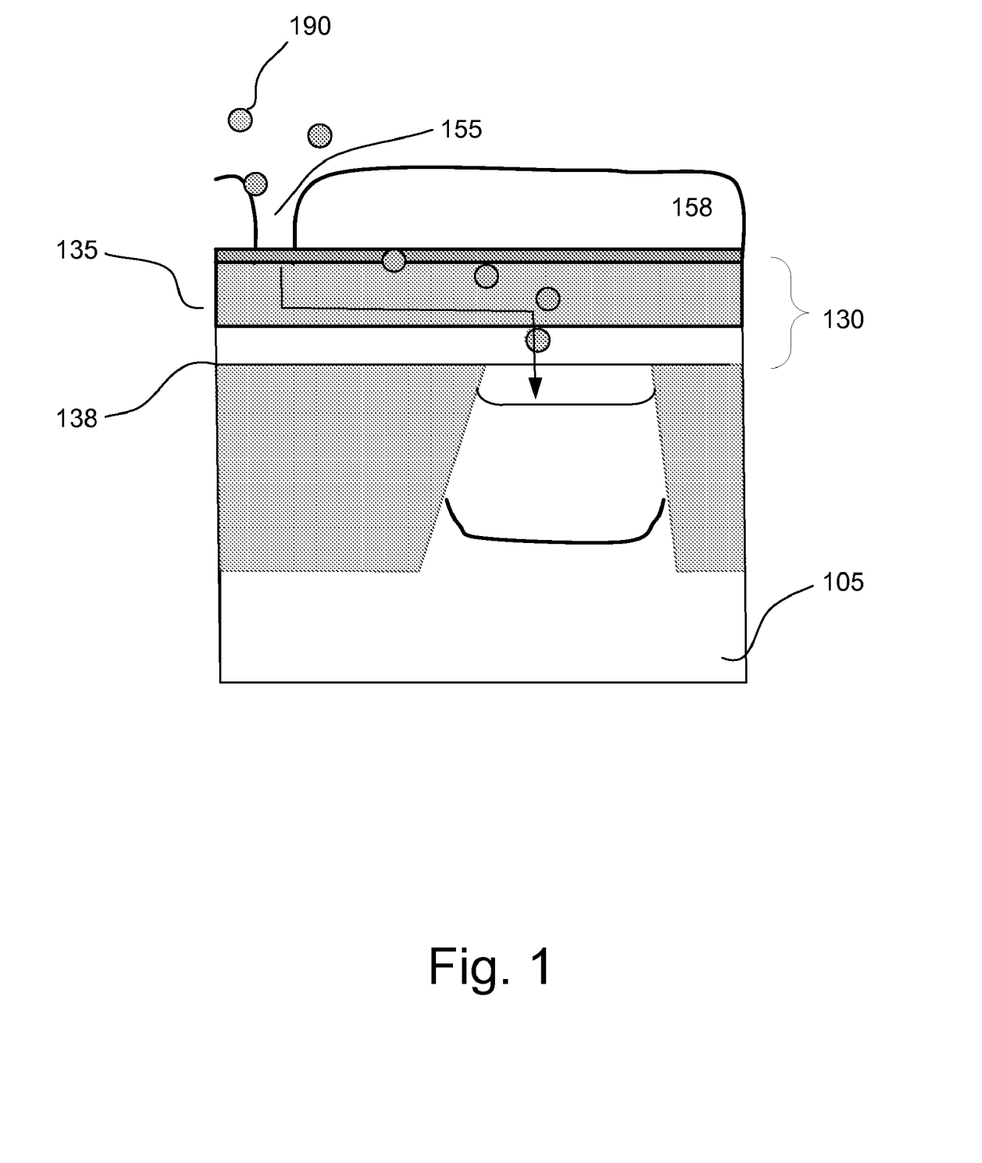
FIG. 1 illustrates PID from a plasma process.

FIG. 1 illustrates plasma induced damage (PID) resulting from a plasma process. As shown, a gate conductor 130 is formed on a substrate 105. The gate conductor includes a gate electrode 135 over a gate oxide 138. RIE is used to etch a contact opening 155 in a dielectric layer 158 to expose the gate conductor. Charged particles 190 generated from the RIE process penetrate through the gate electrode and are trapped in the gate oxide. These trapped charges can cause performance variations, compromising gate oxide integrity and leading to poor process capability (as measured by Cpk).

From the foregoing, it is desirable to reduce PID in integrated circuits.

SUMMARY OF THE INVENTION

The present invention relates to integrated circuits (IC), and more particularly to reducing PID in ICs. In accordance with one aspect of the invention, a circuit is provided. The circuit comprises a circuit control terminal, a primary circuit and a protection circuit. The primary circuit comprises a primary control terminal and a primary gate oxide having a first thickness. The primary control terminal is coupled to the circuit control terminal. The protection circuit comprises a protection control terminal and a protection gate oxide of a second thickness which is less than the first thickness. The protection circuit is coupled to the primary circuit wherein the protection gate oxide reduces plasma induced damage in the primary circuit.

In accordance with another aspect of the invention, a method of forming an IC is provided. The method comprises providing a substrate defined with a first and second active region. A primary circuit is formed in the first active region and a protection circuit in the second active region. The primary circuit includes a primary gate oxide of a first thickness and the protection circuit includes a protection gate oxide having a second thickness which is less than the first thickness. The protection circuit is coupled to the primary circuit wherein the protection gate oxide reduces plasma induced damage in the primary circuit.

An IC which comprises a primary circuit that includes a primary gate oxide of a first thickness and a protection circuit having a protection gate oxide of a second thickness which is less than the first thickness is provided in another aspect of the invention. The protection circuit is coupled to the primary circuit wherein the protection gate oxide reduces plasma induced damage in the primary circuit.

These and other objects, along with advantages and feature of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

Figure 2:
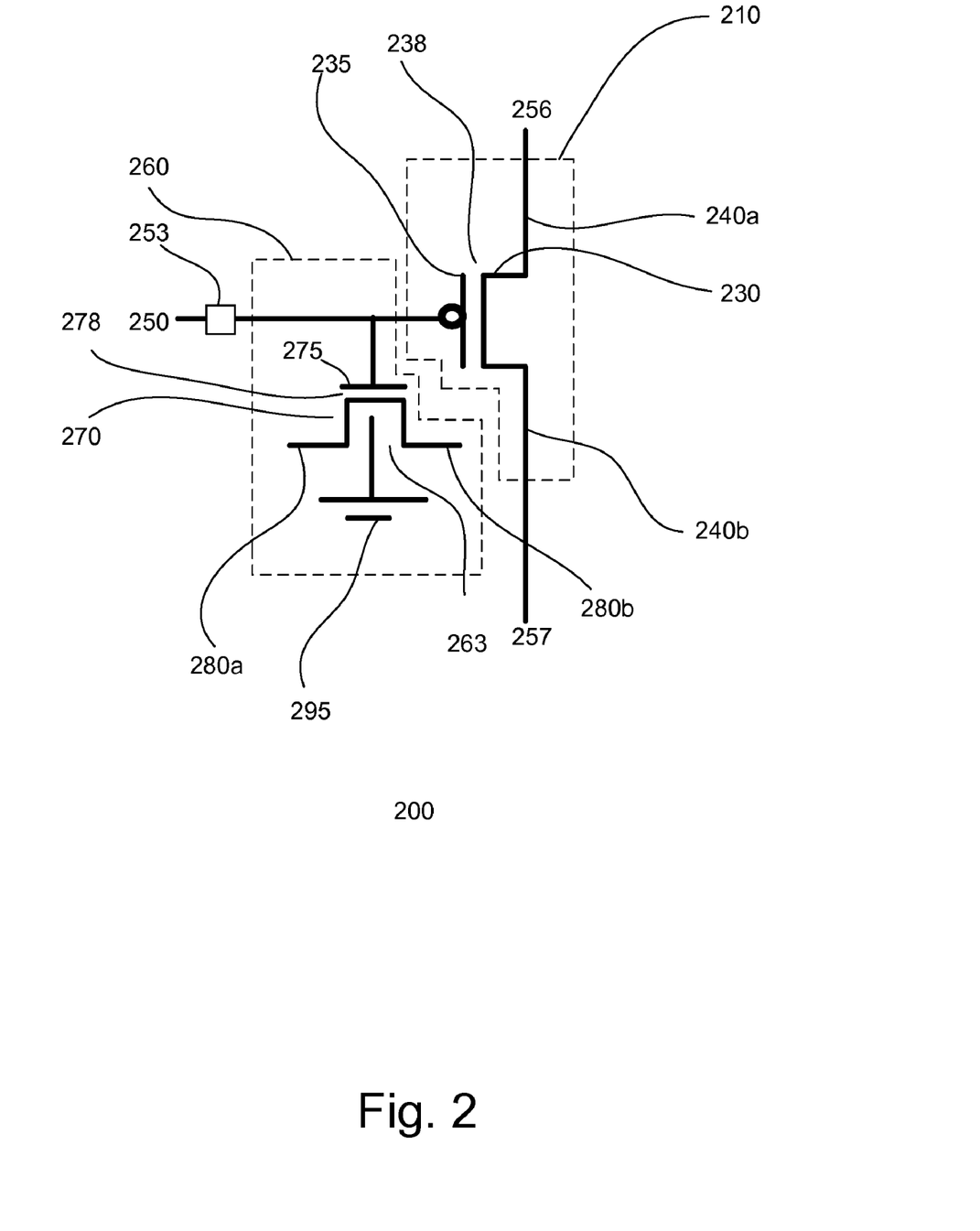
FIG. 2 shows a circuit in accordance with one embodiment of invention.

The present invention relates to reducing PID. FIG. 2 shows a circuit 200 in accordance with one embodiment of the invention. The circuit, for example, is a part of an integrated circuit. The IC, for example, can be dynamic or static random access memory, signal processor, system on chip, mixed signal or analog device such as an A/D converter or switched capacitor filter. Other types of ICs are also useful. The IC, for example, can be incorporated in communication systems and various types of consumer products. As shown, the circuit includes a primary sub-circuit 210 and a protection sub-circuit 260. The protection sub-circuit reduces or prevents charges from being trapped in the primary sub-circuit. In one embodiment, the protection sub-circuit provides a shunt path for reducing or preventing charges from being trapped in the primary sub-circuit.

The primary sub-circuit, in one embodiment, comprises a primary transistor 230. The primary transistor comprises a first type transistor. Illustratively, the first type transistor comprises a p-type transistor. Other types of transistors, such as n-type, are also useful. In one embodiment, a first well of a second type is provided on which the primary transistor is formed. For example, for a p-type transistor, the well comprises a n-type well. The primary transistor comprises a first gate and first type diffusion regions 240a-b. The first gate, for example, includes a first gate electrode 235 and a first gate oxide 238. In one embodiment, the first gate oxide comprises a first thickness $T_1$. Typically $T_1$ is about 3-7 nm. Other thicknesses are also useful.

A control terminal 250 of the circuit is coupled to the gate electrode of the primary transistor. The control terminal is coupled via a control contact 253. First and second circuit terminals 256 and 257 are coupled to the diffusion regions.

In accordance with one embodiment of the invention, the protection sub-circuit is coupled to the input terminal and the gate electrode of the primary transistor. In one embodiment, the protection sub-circuit comprises a protection capacitor. The protection capacitor, for example, comprises a protection transistor 270. The protection transistor comprises a second type transistor. For example, the second type transistor comprises a n-type transistor while the primary transistor comprises a p-type transistor. Alternatively, the second type transistor can be a p-type transistor while the primary transistor is a n-type transistor.

The protection transistor comprises a gate and second type diffusion regions 280a-b. The gate includes a second gate oxide 278 and gate electrode 275. Separating the gate electrode from the protection transistor body 263 is the second gate oxide. The protection gate electrode is coupled to the primary gate electrode and the protection transistor body is coupled to ground 295. In one embodiment, the protection gate electrode is coupled between the control contact and the primary gate electrode. The second gate oxide comprises a second thickness $T_2$. In one embodiment, $T_2$ is less than $T_1$. Preferably, the second gate oxide comprises an ultra-thin gate oxide having a thickness of about 0.5-2.5 nm.

During processing of the control contact, plasma charges are generated. The second gate oxide of the protection transistor, being thinner than the first gate oxide of the primary transistor, provides a semi-resistive shunt path for the charges to flow through. As such, these charges are trapped in the second gate oxide instead of the first gate oxide, thereby avoiding performance degradation of the primary transistor.

Figure 3A:
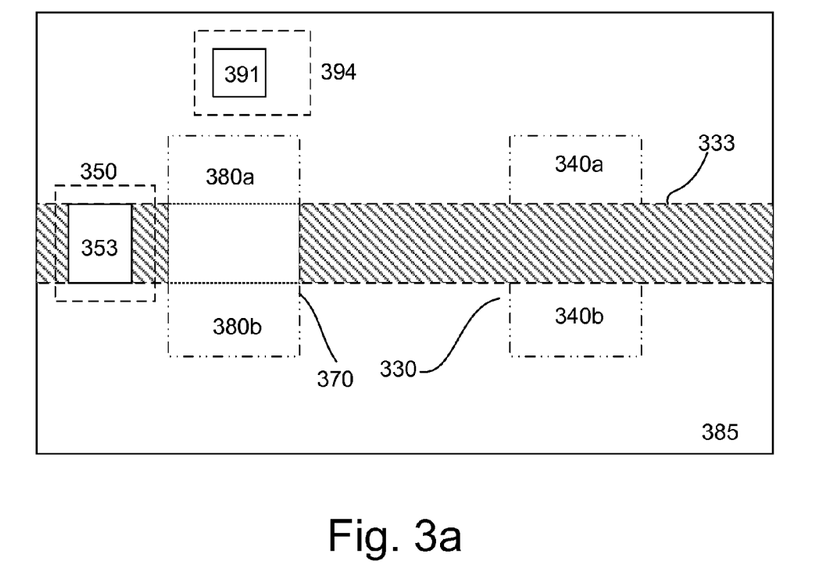
FIGS. 3a-c illustrate top and cross-sectional views of a circuit in accordance with one embodiment of the invention.
Figure 3B:
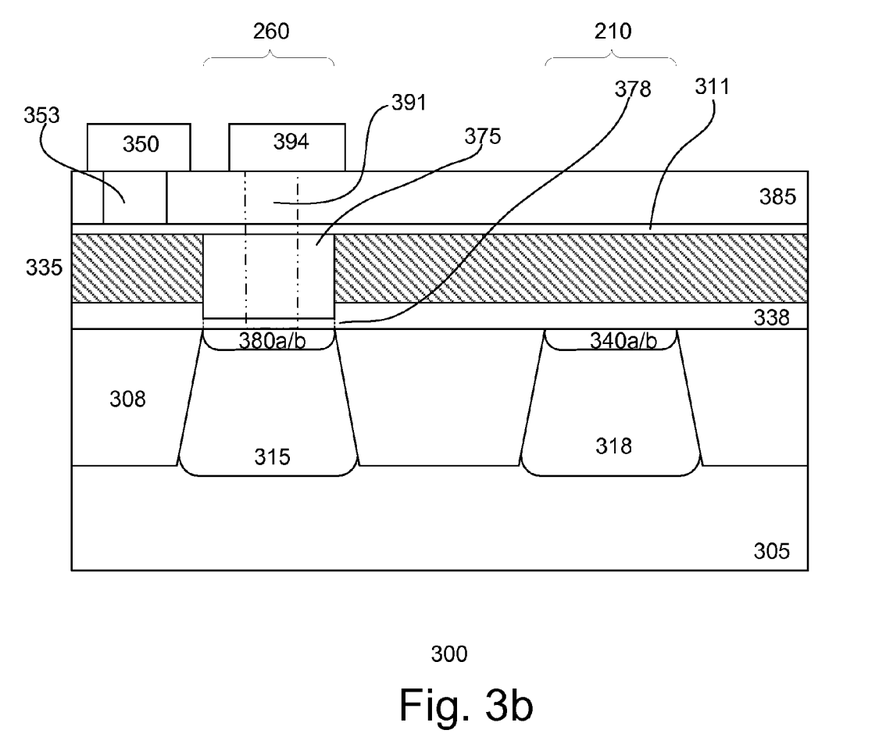

FIGS. 3a-b show top and cross-sectional views of a portion of an IC containing a circuit 300 in accordance with one embodiment of the invention. A substrate 305 on which the circuit is formed is provided. The substrate, for example, comprises a silicon substrate, such as a lightly doped p-type substrate. Other types of substrates, such as silicon on insulator (SOI) or silicon germanium, are also useful. Defined on the substrate are first and second active regions for the protection and primary sub-circuits 260 and 210. In one embodiment, the primary sub-circuit comprises a primary transistor 330 and the protection sub-circuit comprises a protection capacitor in the form of a transistor 370. The transistors, for example, comprise FETs. Other types of transistors are also useful.

Separating the active regions are isolation regions 308. In one embodiment, the isolation regions comprise shallow trench isolation (STI) regions. Other types of isolation regions are also useful.

First and second wells 315 and 318 are provided in the first and second active regions. The first well comprises a second-type doped well for a first-type protection transistor; the second well comprises a first-type doped well for a second-type primary transistor. The first type, for example, comprises p-type and the second type comprises n-type. Alternatively, the first type comprises n-type and the second type comprises p-type.

A primary gate conductor stack 333 is provided on the substrate. In one embodiment, the primary gate conductor stack serves as the gate for the primary transistor. The primary gate conductor stack includes a primary gate electrode layer 335 over a primary gate dielectric layer 338. In one embodiment, a gate contact layer 311, such as metal silicide, is provided over the primary gate electrode layer. The gate electrode layer comprises, for example, polysilicon or metal while the gate dielectric layer comprises silicon oxide or oxy-nitride. Other types of gate electrode and gate dielectric materials are also useful. For example, the gate electrode material can comprise metal, heavily doped polysilicon, undoped polysilicon, metal silicide such as nickel silicide, or metal such as TiN, Ta, TaN and TaSiN, while the gate dielectric material can comprise oxynitride-based materials such as silicon oxynitride. The gate dielectric layer comprises a first thickness $T_1$. $T_1$, for example, is about 3-7 nm. Other thicknesses are also useful. First type diffusion regions 340a-b are provided in the second active region adjacent to the gate conductor stack, forming the primary transistor.

In the first active region, the protection transistor is formed. In one embodiment, the gate of the protection transistor comprises a protection gate electrode 375 and protection gate oxide 378. The protection gate electrode is formed along the gate conductor over the first active region. In one embodiment, the top surface of the protection gate electrode is coplanar with the top surface of the primary gate electrode. In one embodiment, a bottom surface of the protection gate electrode is below a bottom surface of the primary gate electrode, causing the protection gate oxide to have a second thickness $T_2$ which is less than $T_1$. $T_2$, for example, is about 0.5-2.5 nm. Second type diffusion regions 380a-b are provided in the first active region adjacent to the protection gate, forming the protection transistor.

A dielectric layer 385 is provided over the gate conductor, covering it and the substrate. The dielectric layer serves, for example, as an interlevel dielectric (ILD) layer, isolating the transistors from the metal layer above. A gate conductor contact 353 is located in the ILD layer, coupling the primary gate conductor to a first conductive line 350 which serves as the control terminal. In accordance with one embodiment of the invention, the protection transistor is located between the gate conductor contact and primary transistor. Additionally, a well contact 391 is provided in the dielectric layer, coupling the first active region to ground via a second conductive line 394, where charges can be discharged or shunted to ground. The conductive lines, for example, comprises copper. Other types of conductive materials are also useful. The conductive lines discharge to ground any charges flowing through the protection transistor.

Figure 3C:
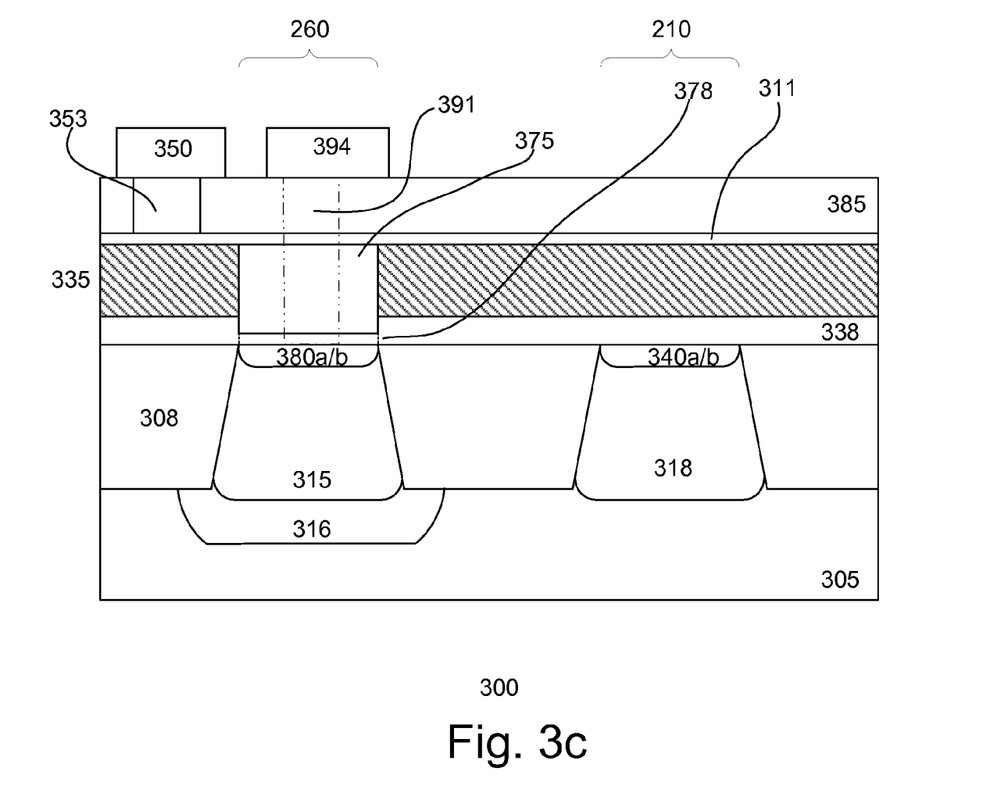

In an alternative embodiment, the circuit can incorporate a triple well configuration. The triple well can be provided for the n-type transistor. In a triple well configuration, a deep n-well is provided which encompasses the p-well in which the n-type diffusion regions are formed. For example, as shown in FIG. 3c, the protection transistor which is a n-type transistor includes a deep n-well 316, p-well 315 and n-type diffusion regions 380a-b. The triple well can alternatively be provided for the primary sub-circuit for applications where the primary transistor comprises a n-type transistor.

Figure 4:
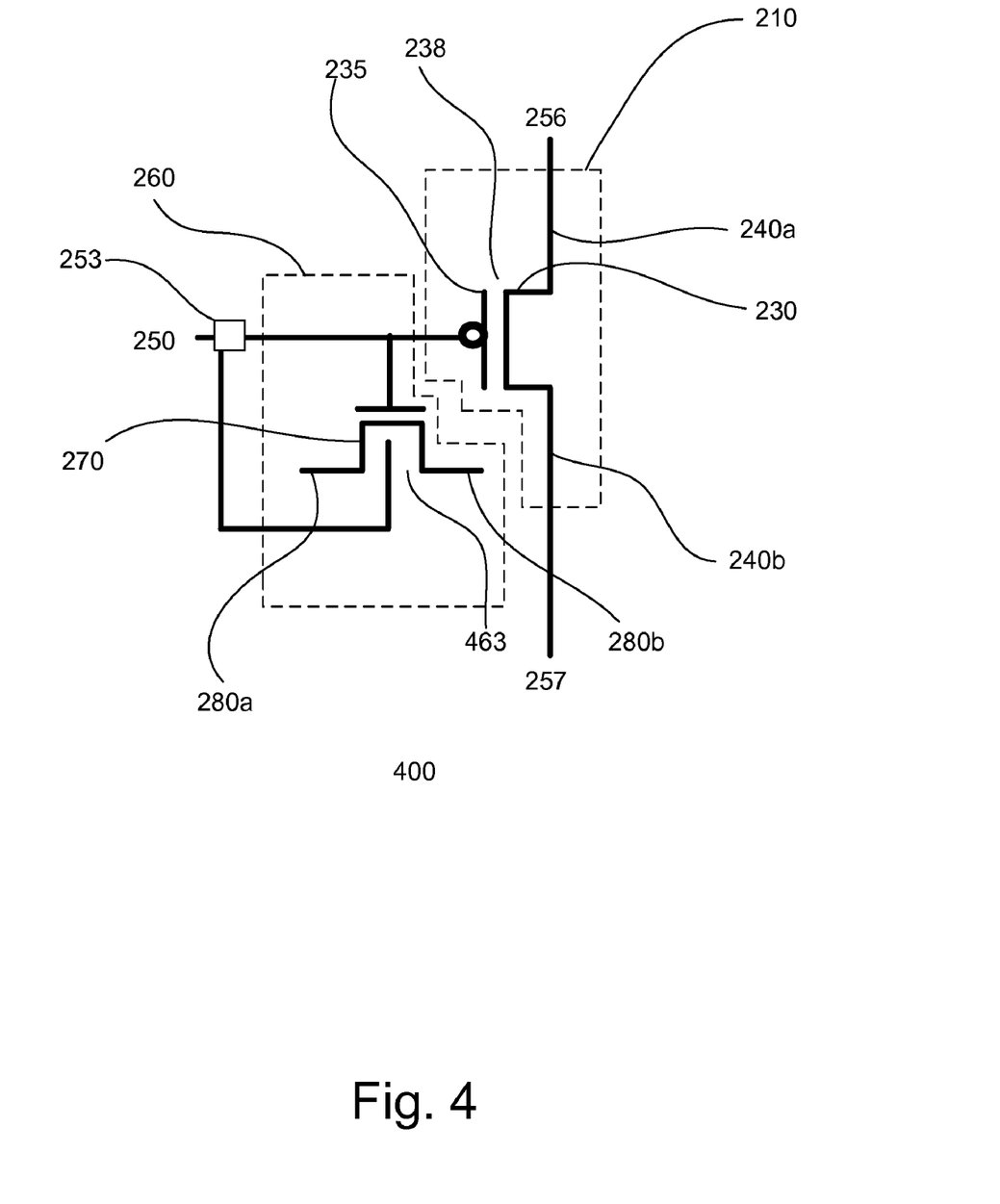
FIG. 4 shows a circuit in accordance with another embodiment of the invention.

FIG. 4 shows a circuit 400 in accordance with one embodiment of the invention. The circuit, for example, is a part of an IC. The circuit is similar to the circuit of FIG. 2 except that the protection capacitor of the protection sub-circuit is shorted to the control terminal 250. In one embodiment, the protection capacitor comprises a protection transistor 270. A body 463 of the protection transistor is coupled to the control input 250. By shorting the protection capacitor, leakage through the protection capacitor during operation can be avoided, improving performance of the circuit.

Figure 5A:
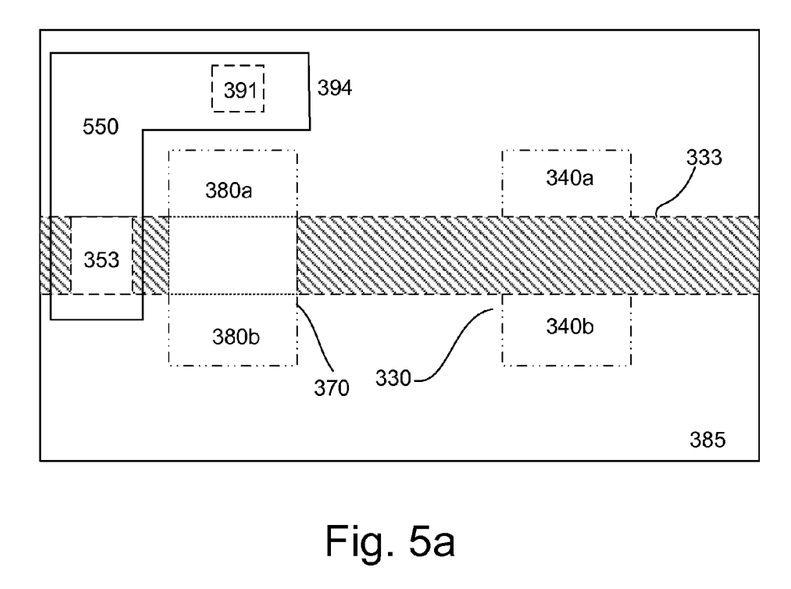
FIGS. 5a-b illustrate top and cross-sectional views of a circuit in accordance with another embodiment of the invention.
Figure 5B:
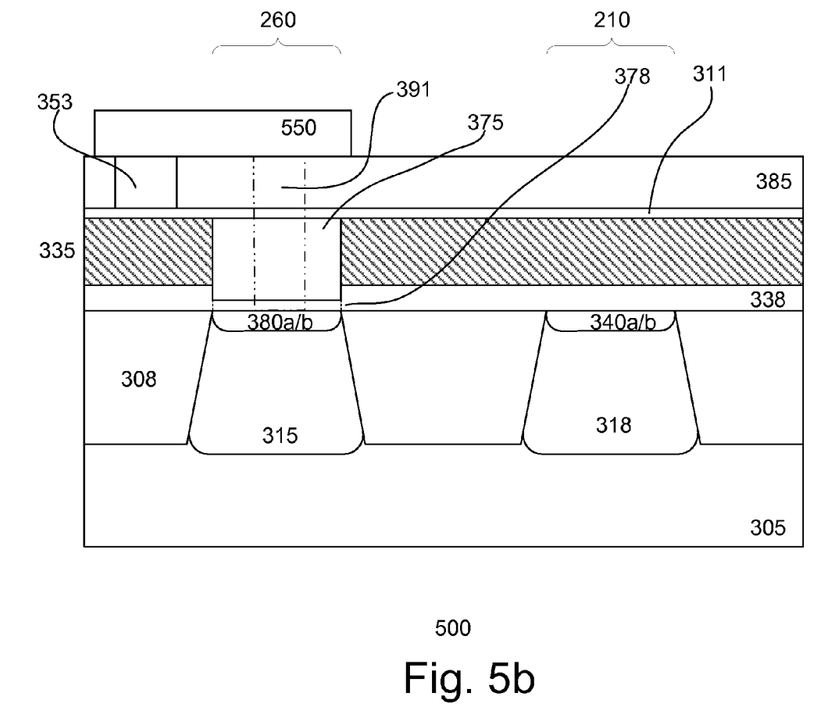

FIGS. 5a-b show top and cross-sectional views of a portion of an IC containing a circuit 500 in accordance with one embodiment of the invention. The circuit, as shown, is similar to that shown in FIGS. 3a-b except that the gate contact 353 and well contact 391 are coupled by conductive line 550, shorting the second well to the control input terminal.

FIGS. 6a-b-12a-b show a process for forming a circuit 600 in accordance with one embodiment of the invention. A substrate 605 on which the circuit is formed is provided. In one embodiment, the substrate comprises a silicon substrate. Other types of substrates, such as SOI or silicon germanium, are also useful. As shown, the substrate is prepared with first and second doped wells 615 and 618 corresponding to first and second active regions. In one embodiment, the first well comprises a second-type doped well and the second well comprises a first type doped well. To form the wells, conventional ion implantation techniques, such as implantation with a mask can be used. Other techniques for forming the active regions are also useful.

Figure 6A:
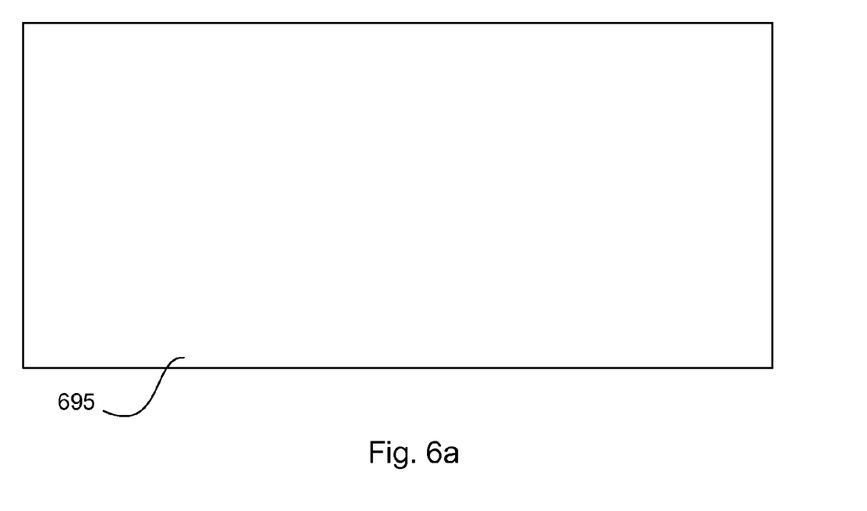
FIGS. 6a-b-12a-b illustrate a process of forming a circuit in accordance with one embodiment of the invention.
Figure 6B:
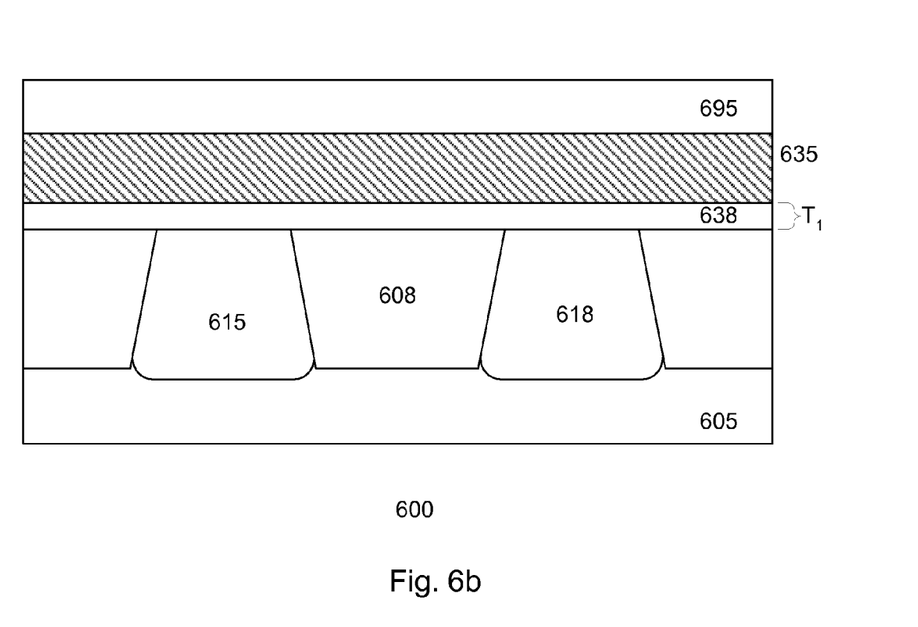

Isolating the active regions from other device regions on the substrate are isolation regions 608. The isolation regions, for example, comprise STI regions. Various conventional processes can be employed to form the STI regions. For example, the substrate can be etched using conventional etch and mask techniques to form trenches which are then filled with dielectric material such as silicon oxide. Chemical mechanical polishing (CMP) can be used to remove excess dielectric material and to provide a planar top surface with the substrate. The STI regions can be formed, for example, prior to or after the formation of the doped wells.

Layers of gate stack are formed above the substrate. The gate stack, for example, comprises a first gate oxide 638 and a first gate electrode 635. Other types of gate stacks are also useful. As shown, the first gate oxide comprises a thickness $T_1$. $T_1$, for example, is about 3-7 nm, while the first gate electrode is typically about 500 Å-1500 Å. Other thicknesses are also useful. Conventional techniques can be used to form the various layers of the gate stack. For example, the first gate oxide can be formed by thermal oxidation while the gate electrode can be formed by chemical vapor deposition (CVD). Other techniques or types of layers can also be useful. A mask layer 695 is formed over the substrate, covering the gate stack. In one embodiment, the mask layer comprises photoresist. Typically, an anti-reflective coating (ARC) is provided beneath the mask layer.

Figure 7A:
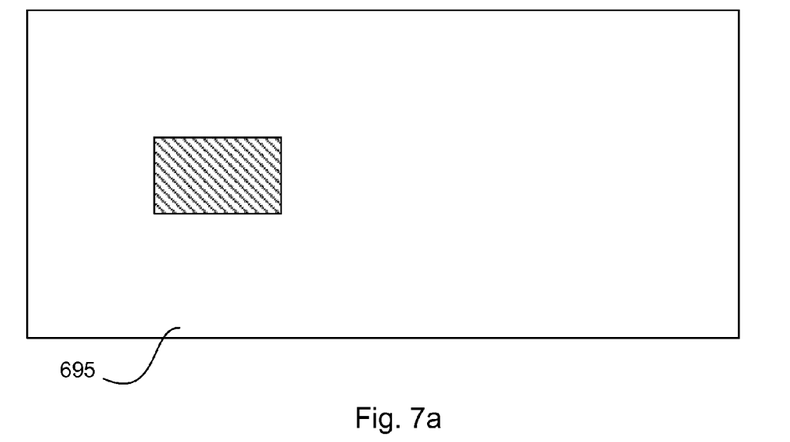
Figure 7B:
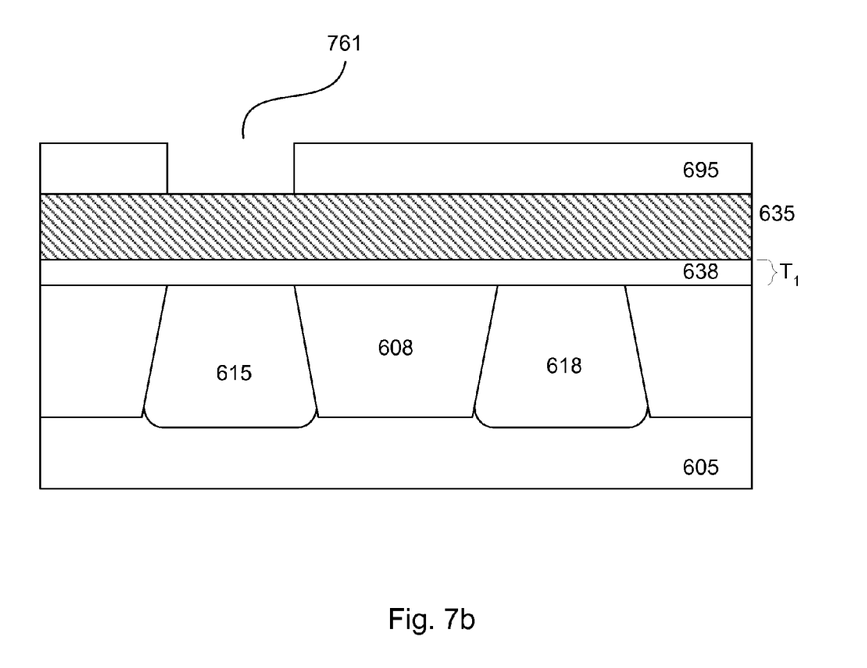
Figure 8A:
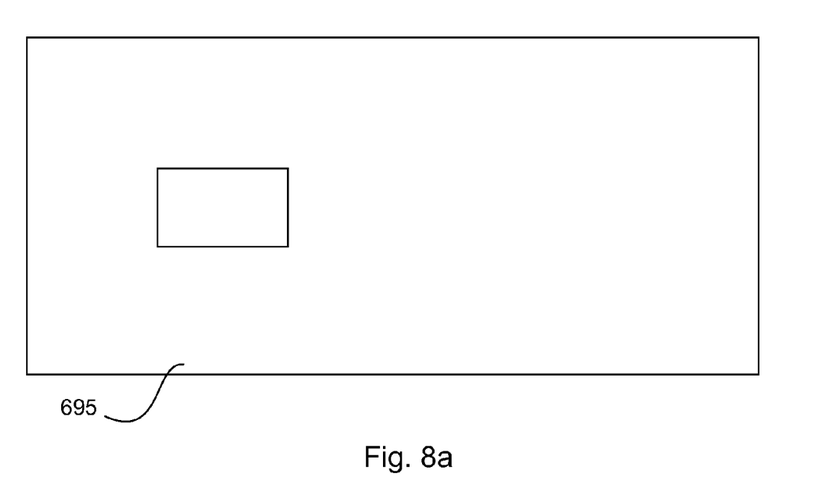
Figure 8B:
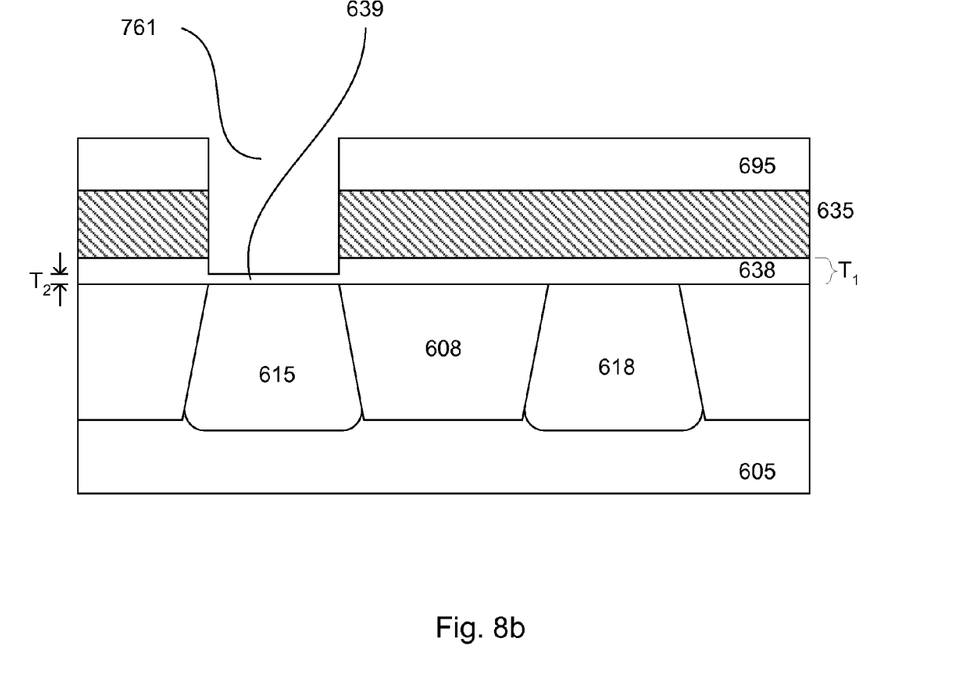

In FIGS. 7a-b, the mask layer is patterned, creating an opening 761 where the gate of the protection transistor is to be formed. As shown in FIGS. 8a-b, the opening exposes a portion of the first gate electrode and gate oxide which are removed by, for example, an anisotropic etch such as RIE. Next, a second gate oxide is formed on the exposed portion of the substrate. The second gate oxide 639 can be formed, for example, by thermal oxidation. In one embodiment, the thickness of the gate dielectric layer is reduced to $T_2$. Typically, $T_2$ is about 0.5-2.5 nm. Other thicknesses are also useful.

Figure 9A:
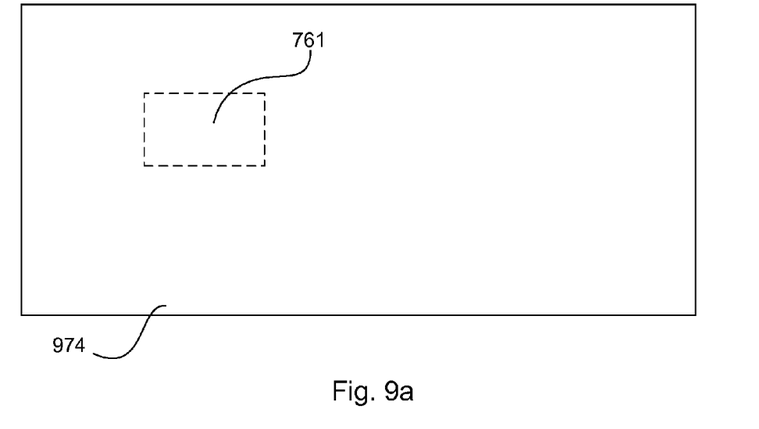
Figure 9B:
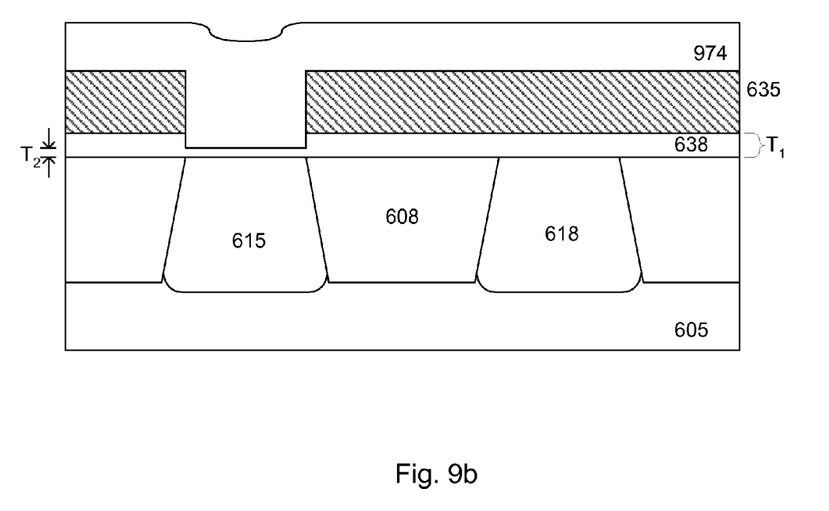
Figure 10A:
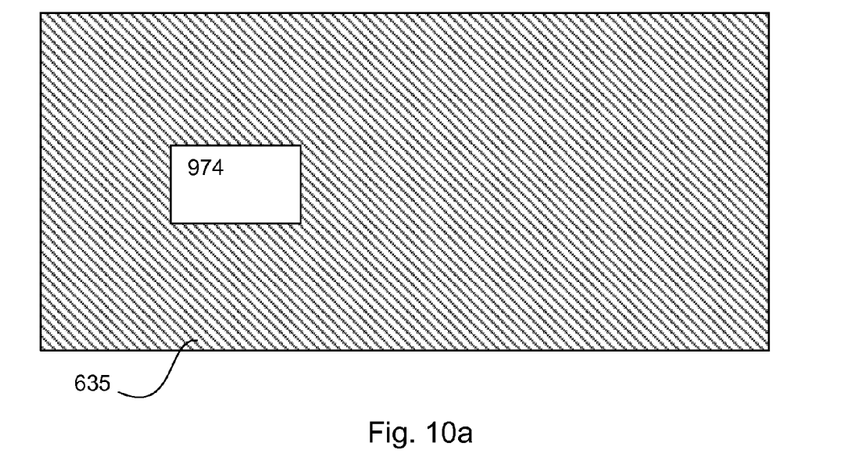
Figure 10B:
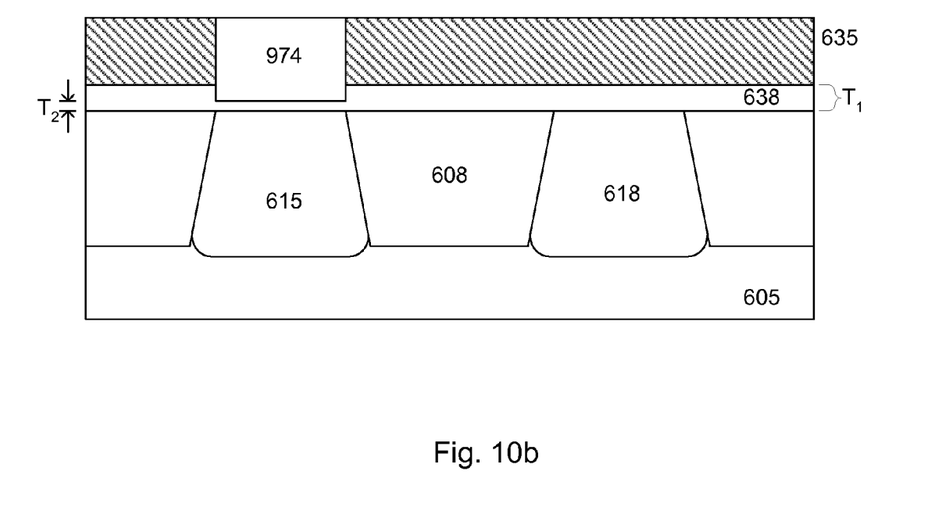

Referring to FIGS. 9a-b, the mask layer is removed. After mask removal, a second electrode 974 is deposited on the substrate, filling opening 761 and covering the first electrode. Preferably, the second electrode comprises the same material as the first electrode. Having different first and second electrodes is also useful. In FIGS. 10a-b, the substrate is planarized by, for example, CMP, providing a planar substrate top surface between the first and second gate electrodes.

Figure 11A:
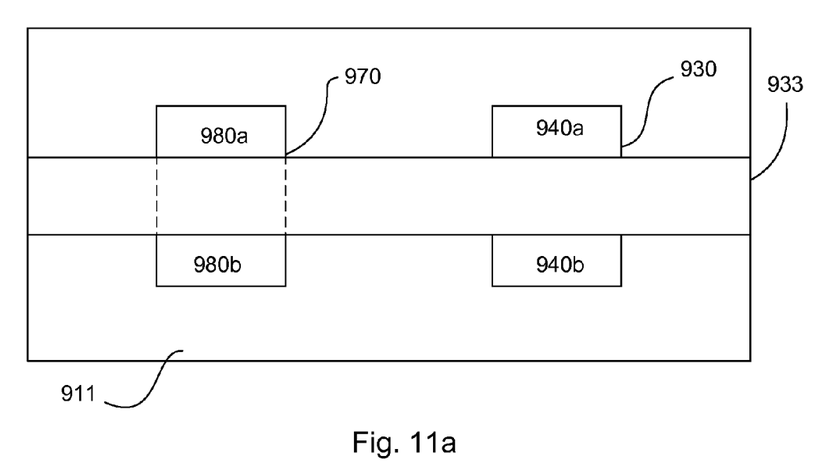
Figure 11B:
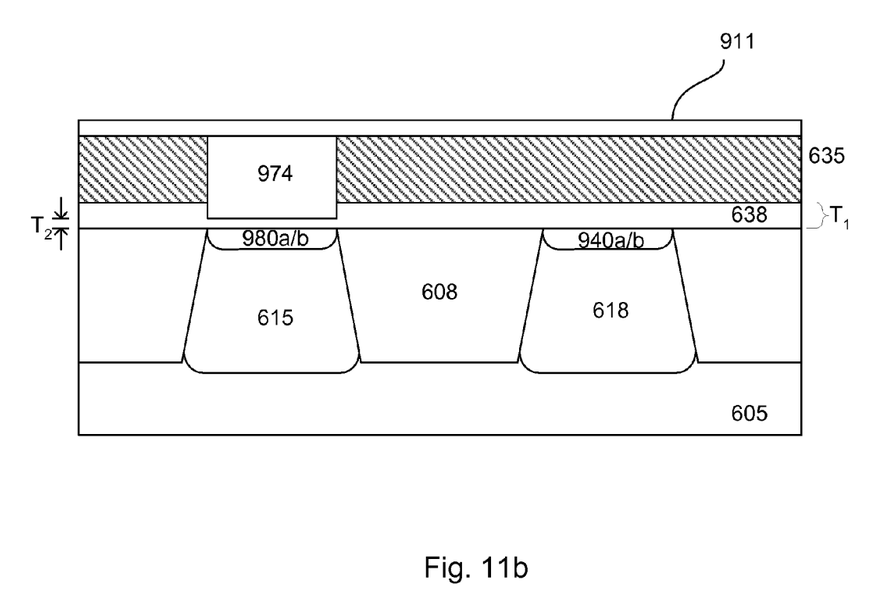

Referring to FIGS. 11a-b, the substrate is processed to form primary and protection transistors 930 and 970. In one embodiment, the process includes patterning the first electrode to form a primary gate conductor 933. This produces primary and protection gates. After patterning of the gate conductor, first and second diffusion regions are formed in the first and second active regions adjacent to the protection and primary gates. The first diffusion regions 980a-b, for example, comprise heavily doped regions of the first polarity type and the second diffusion regions 940a-b comprise heavily doped regions of the second polarity type. The doped regions can be formed by ion implantation. The implant can be self-aligned or formed using an implant mask. Other techniques for forming the diffusion regions are also useful. Dielectric spacers (not shown) can be formed on the gate sidewalls. A contact layer 911 can be formed on the gate. The contact layer, for example, comprises metal silicide such as nickel or alloy thereof. Other types of contact layers are also useful.

Figure 12A:
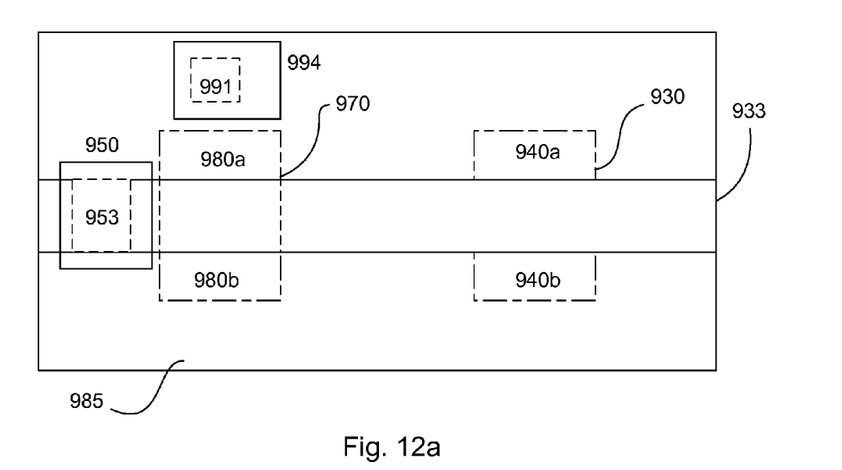
Figure 12B:
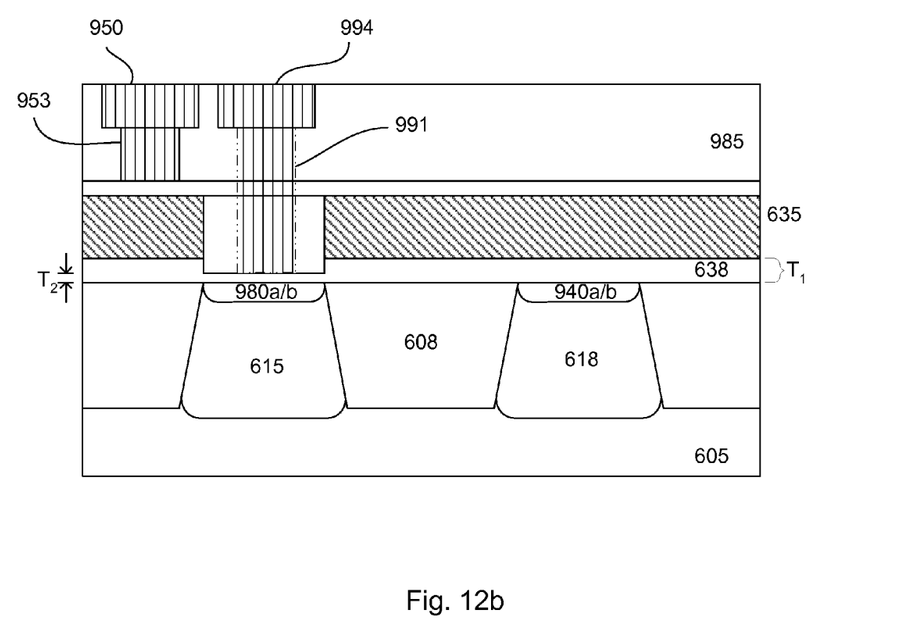

FIGS. 12a-b shows a dielectric layer 985 formed over the substrate, covering the transistors. The dielectric layer can comprise, for example, silicon oxide. Other types of dielectric materials, such as silicon oxynitride, are also useful. The dielectric layer can be formed using various techniques, such as CVD, rapid thermal oxidation or furnace annealing.

Figure 13A:
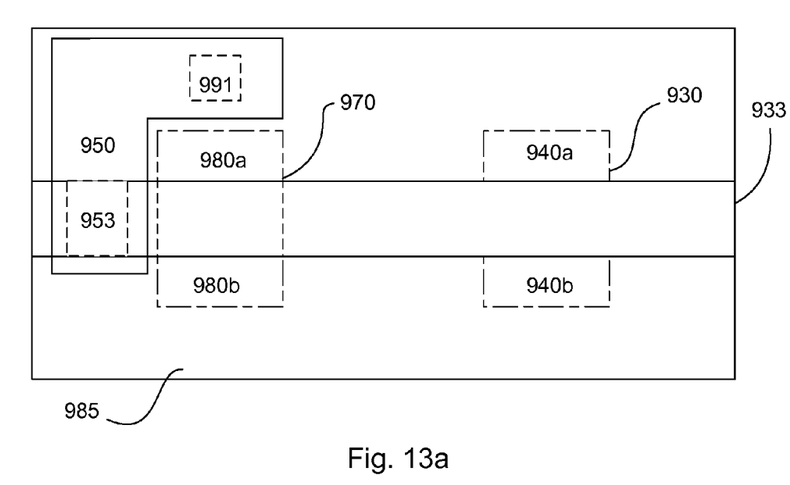
FIGS. 13a-b illustrate a process of forming a circuit in accordance with another embodiment of the invention.
Figure 13B:
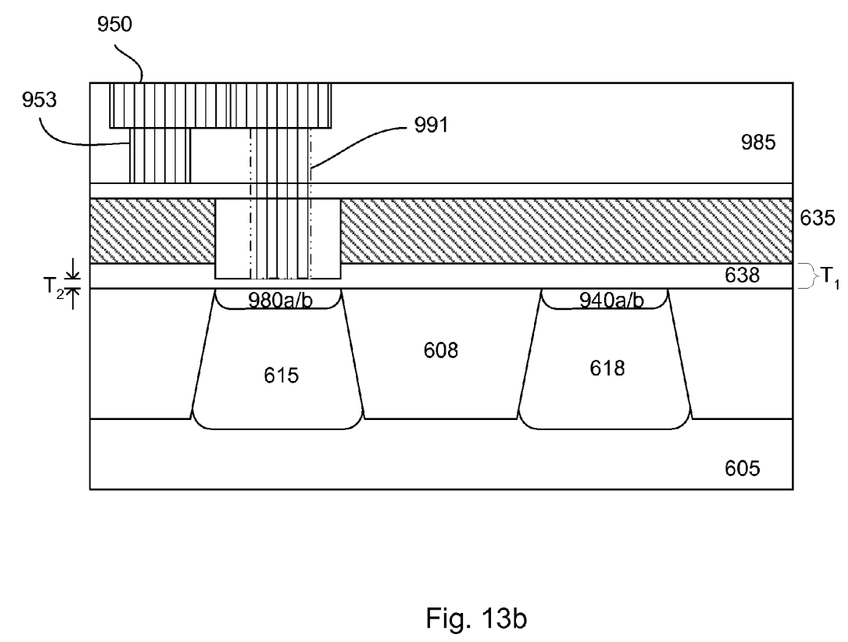

Interconnections are formed in the dielectric layer. In one embodiment, the interconnections include gate conductor and well contacts 953 and 991. The gate conductor contact is coupled to a first conductive line 950 while the well contact is coupled to a second conductive line 994. In one embodiment, the first conductive line serves as the control terminal and the second conductive line is coupled to ground. Alternatively, as shown in FIGS. 13a-b, the gate conductor and well contacts are commonly coupled to a conductive line 950 serving as the control terminal. Other interconnections can also be formed. For example, interconnections to the diffusion regions of the primary transistor (not shown) can also be formed.

Various techniques can be used to form the interconnections, such as single damascene or dual damascene techniques. The conductive lines and contacts, for example, can comprise copper. Other types of conductive materials are also useful. It is further understood that the contacts and lines can be formed from different materials, for example, tungsten contacts and copper lines. The process continues to form the IC.

The process described above is just an example and not necessarily in sequence. The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a circuit of an integrated circuit (IC) comprising:

providing a substrate on which the IC is formed;

defining first and second regions on the substrate; and forming a primary circuit in the first region and a protection circuit in the second region, the protection circuit is coupled to the primary circuit, wherein the primary circuit comprises a primary transistor of a second type in a primary well of a first type in the first region, the primary circuit includes a primary gate oxide of a first thickness $T_1$, and the protection circuit comprises protection transistor of a first type in a protection well of a second type in the second region, the protection circuit includes a protection gate oxide of a second thickness $T_2$ which is less than $T_1$, the protection gate oxide traps charges to reduce plasma induced damage in the primary circuit.

2. The method of claim 1 wherein forming primary and protection transistors comprises forming a gate conductor serving as a common gate of the primary and protection transistors.

3. The method of claim 2 wherein the protection gate is disposed between the primary transistor and an input terminal of the circuit.

4. The method of claim 3 wherein:

the first type comprises p-type and second type comprises n-type; or the first type comprises n-type and the second type comprises p-type.

5. A method of forming a semiconductor device comprising:
provide a substrate;
forming a circuit control terminal on the substrate;
forming a primary circuit, the primary circuit comprises a primary transistor of a first type disposed in a primary well of a second type, the primary circuit having a primary control terminal, the primary circuit includes a primary gate oxide of a first thickness $T_1$, the primary control terminal coupled to the circuit control terminal; and
forming a protection circuit, the protection circuit comprises a protection transistor of a second type disposed in a protection well of a first type, the protection circuit having a protection control terminal, the protection circuit includes a protection gate oxide of a second thickness $T_2$ which is less than $T_1$, the protection circuit is coupled to the primary circuit, wherein the protection gate oxide traps charges to reduce plasma induced damage in the primary circuit.

6. The method in claim 5 wherein the primary and protection control terminals are commonly coupled.

7. The method in claim 6 wherein the protection circuit is disposed between the circuit control terminal and primary circuit.

8. The method in claim 5 wherein the primary and protection control terminals are commonly coupled to the circuit control terminal, the protection control terminal disposed between the circuit control terminal and primary control terminal.

9. The method in claim 5 wherein the protection well is coupled to ground.

10. The method in claim 5 wherein the protection well is coupled to the circuit control terminal.

11. The method in claim 5 wherein:
the first type comprises p-type and second type comprises n-type; or
the first type comprises n-type and the second type comprises p-type.

12. The method in claim 5 wherein:
the primary transistor includes,
a gate stack with a primary gate electrode over the primary gate oxide, and
first and second primary diffusion regions adjacent to the primary gate stack, wherein the gate electrode serves as the control terminal and the first and second diffusion regions serve as first and second circuit terminals; and
the protection transistor includes,
a protection gate stack with a protection gate electrode over the protection gate oxide, and
first and second protection diffusion regions adjacent to the protection gate stack, wherein the protection gate electrode serves as the protection control terminal.

13. The method in claim 12 wherein the protection well is coupled to ground.

14. The method in claim 13 wherein:
the first type comprises p-type and second type comprises n-type; or
the first type comprises n-type and the second type comprises p-type.

15. The method in claim 13 wherein gate stacks of the primary and protection transistors form a common gate conductor.

16. The method in claim 12 wherein the protection well is coupled to the circuit control terminal.

17. The method in claim 12 wherein gate stacks of the primary and protection transistors form a common gate conductor.

18. A method of forming an integrated circuit comprising:
providing a substrate;
forming a primary circuit on the substrate, wherein the primary circuit comprises a primary transistor of a first type, the primary transistor includes a primary gate oxide of a first thickness $T_1$; and
forming a protection circuit on the substrate coupled to the primary circuit, wherein the protection circuit comprises a protection transistor of a second type, the protection transistor includes a protection gate oxide of a second thickness $T_2$ which is less than $T_1$, wherein the protection gate oxide traps charges to reduce plasma induced damage in the primary circuit.

19. The method in claim 18 wherein the primary and protection circuits comprise control terminals which are commonly coupled.

20. The method of claim 18 wherein forming primary and protection transistors comprises forming a gate conductor serving as a common gate of the primary and protection transistors.

* * * * *